United States Patent [19]
Wanlass

[11] Patent Number: 6,090,672
[45] Date of Patent: Jul. 18, 2000

[54] ULTRA SHORT CHANNEL DAMASCENE MOS TRANSISTORS

[76] Inventor: Frank M. Wanlass, 2655 Keystone Ave., Apt. 4, Santa Clara, Calif. 95051

[21] Appl. No.: 09/120,953

[22] Filed: Jul. 22, 1998

[51] Int. Cl.⁷ .................................................. H01L 21/336
[52] U.S. Cl. ........................ 438/301; 438/585; 438/197; 438/299
[58] Field of Search .................................... 438/301, 197, 438/299, 595

[56] References Cited

U.S. PATENT DOCUMENTS 5,960,270  9/1999  Misra et al. ............................ 438/197

*Primary Examiner*—Richard T. Elms
*Assistant Examiner*—Brad Smith

[57] ABSTRACT

This invention is a damascene processing method for forming ultra short channel MOS transistors, where the channel length is not determined by photolithography. The method uses chemical mechanical polishing to self align an MOS transistor gate electrode to the MOS channel region in both the width and length directions. The method enables metal interconnect lines to make borderless connections to the MOS gate electrodes directly over channel regions, and allows borderless connections to be made to the MOS source and drain regions, thereby improving layout density of small transistors. The method uses metal for first level interconnect lines rather than polysilicon. The method enables the interconnect lines to be patterned on a planar surface, which facilitates the etching of very narrow and closely spaced lines. The method does not require any Shallow Trench Isolation (STI), and does not require Local Oxidation of Silicon (LOCOS), thereby resulting in little damage to the silicon substrate. The method also prevents plasma damage of very thin gate dielectrics during processing.

12 Claims, 8 Drawing Sheets

FIG. 3A  Side View

FIG. 3B  Top View

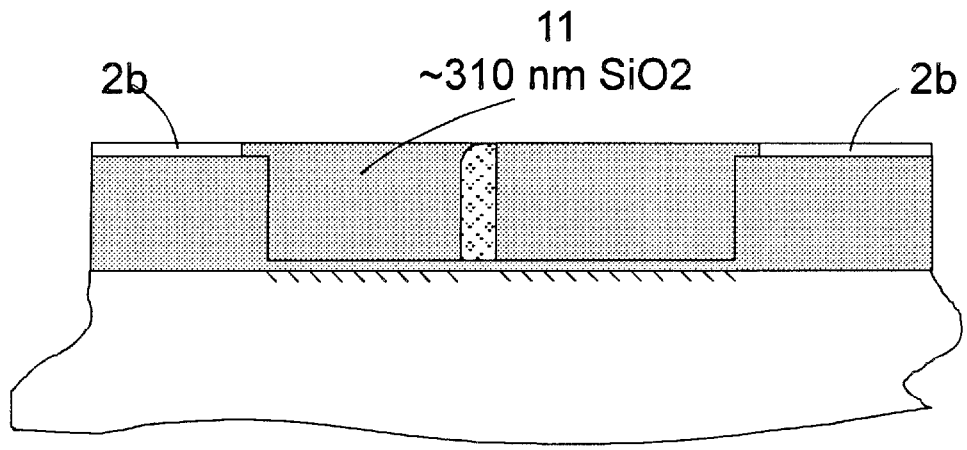
FIG. 6A
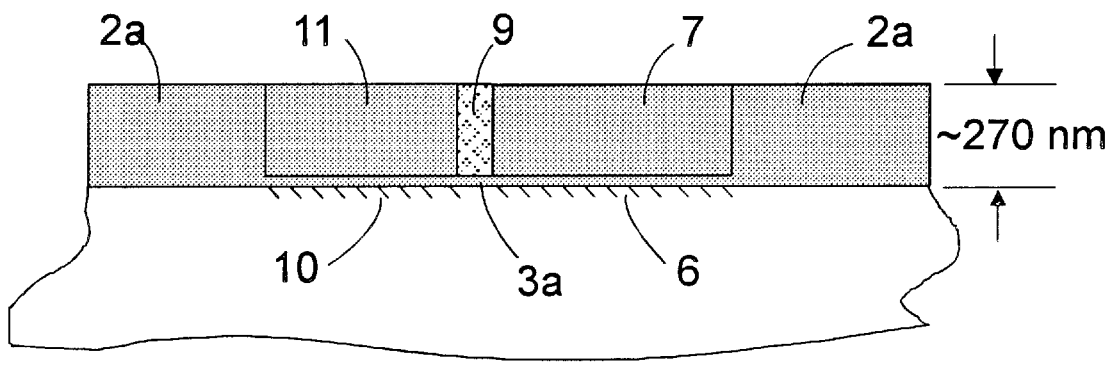
FIG. 6B  Side View
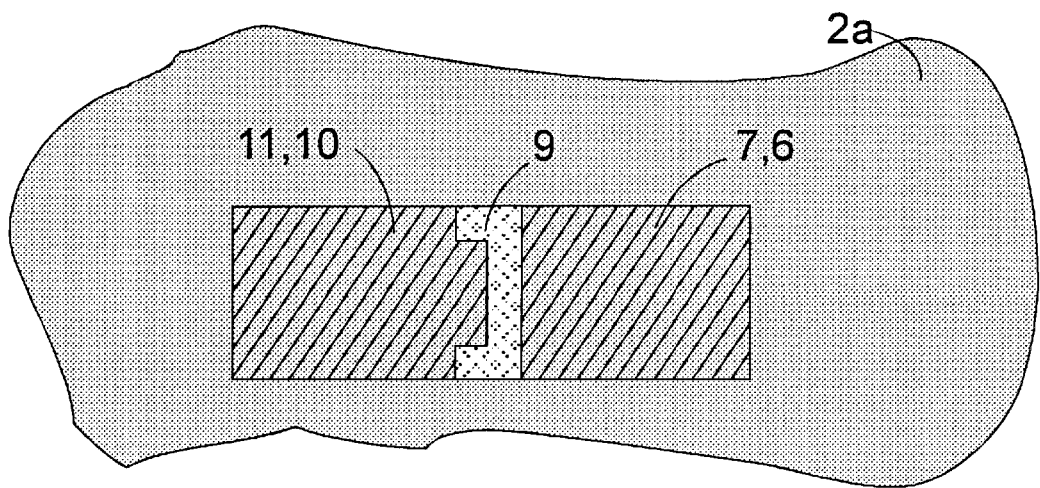
FIG. 6C  Top View

6,090,672

ULTRA SHORT CHANNEL DAMASCENE MOS TRANSISTORS

FIELD OF THE INVENTION

This invention is a damascene processing method for forming an MOS transistor where the channel length is less than 100 nm, where the gate electrode is self aligned to the channel region in both the width and length directions, and where a metal interconnect line makes borderless connection to the gate electrode, and where metal interconnect lines make borderless connections to the source and drain diffusions. The method does not require any defect generating heavy oxidation of the silicon.

BACKGROUND OF THE INVENTION

MOS silicon gate technology defines an MOS transistor location by a field oxide opening, and defines the MOS channel region location by a polysilicon gate electrode overlying this opening. The width of the polysilicon (poly) determines the channel length L, and the width of the field oxide opening determines the channel width W. The poly is made longer than the channel width to allow for misalignment tolerance. For a very narrow sub micron channel width this tolerance can be almost as large as the width. Furthermore, if a metal connection is to be made to the poly, the poly has to extend even further beyond the channel width to make room for a contact hole to the metal, severely limiting layout density.

Another fundamental problem with silicon gate technology arises from the fact that the polysilicon is used for a first layer interconnect as well as defining the MOS gate electrodes. This means that polysilicon cannot be patterned to freely cross over a diffusion without also creating an MOS transistor at the cross over location.

Yet another fundamental problem with silicon gate technology is that the channel length L is determined by the poly width, which width is determined by the width of radiation patterned photoresist. To produce ever faster circuits, it is desirable to make L as short as possible; however, it becomes very difficult to pattern photoresist line widths to be less than 100 nm.

SUMMARY OF THE INVENTION

The present invention is a method for forming MOS transistors where the gate electrodes are automatically aligned to the transistor channel regions in both the width and the length directions, and where interconnect metal makes borderless contact to the gate electrodes directly above channel regions, and where interconnect metal makes borderless contact to diffused source and drain regions. This invention also controls the MOS channel length using a method that does not depend on the exposure of very narrow photoresist lines. In addition, this invention enables the use of metal for first level interconnections rather than polysilicon, allowing MOS transistors to be placed only where desired.

In addition, this invention:

1—Allows the use of gate electrodes made from metal or other conductors.

2—Provides a planar surface for facilitating photo masking of very narrow and closely spaced metal interconnections.

3—Prevents plasma damage of gate dielectrics during processing.

4—Minimizes substrate defects by not using Local Oxidation of Silicon (LOCOS), or Shallow Trench Isolation (STI).

BRIEF DESCRIPTION OF THE DRAWINGS

FIGS. 3A–3C show the wafer after depositing a thick layer of silicon dioxide, after chemical mechanical polishing this thick layer, and after depositing a second thin layer of silicon dioxide.

FIGS. 4A–5C show the wafer after patterning photoresist, after removing the second thin silicon dioxide and amorphous silicon, and after depositing a second thin amorphous silicon layer.

FIGS. 5A–5C show the wafer after plasma etching the second amorphous silicon, after patterning photoresist, after etching again the second amorphous silicon, and after implanting a second N+ dopant.

FIGS. 6A–6C show the wafer after depositing and chemical mechanical planarizing a thick silicon dioxide layer, after removing the thin silicon nitride, and after a touch up chemical mechanical polishing.

DETAILED DESCRIPTION OF THE INVENTION

Figure 1A:
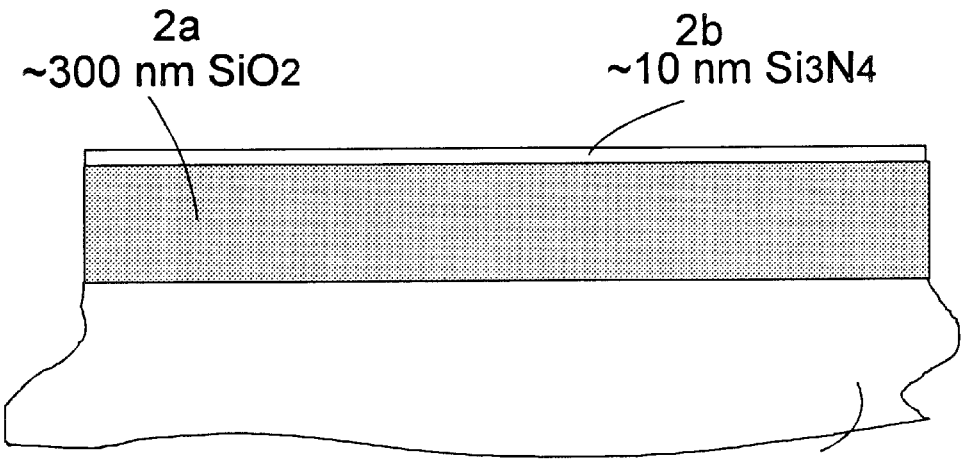
FIG. 1A shows a cross section of a portion of a P type wafer coated with a thick silicon dioxide layer, and a thin silicon nitride layer.

The following is a description of a preferred process flow for forming ultra short channel NMOS transistors; the steps for forming PMOS transistors are not described, but will be the same except for the use of a P+ implant instead of an N+ implant, and the use of N-implants instead of P- implants:

1. FIG. 1A shows, at the start of the process, a portion of a P type single crystal silicon substrates first coated with a layer 2a of silicon dioxide ($SiO_2$) ~300 nm thick, followed by a layer 2b of silicon nitride ($Si_3N_4$)~10 nm thick.

Figure 1B:
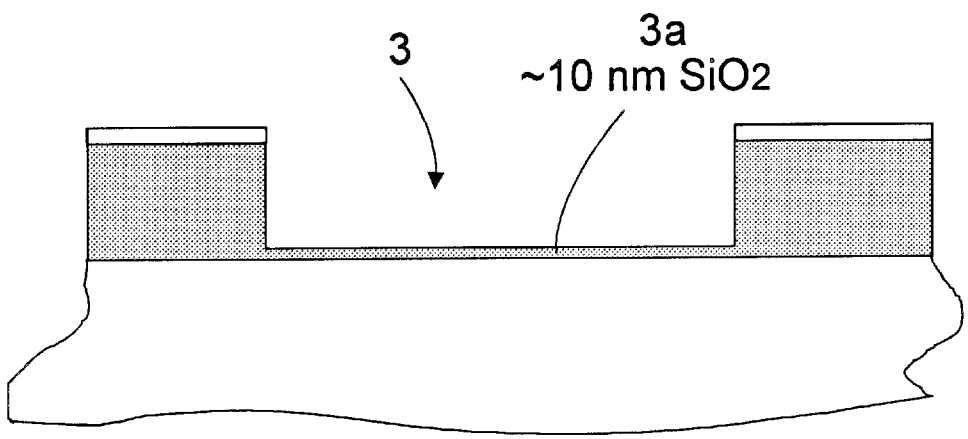
FIG. 1B shows an opening etched to the wafer, and a first thin layer of silicon dioxide grown at the bottom of the opening.

2. Photoresist is patterned and the $Si_3N_4$ layer 2b is anisotropically plasma etched using chlorine chemistry, then the $SiO_2$ layer 2a is anisotropically plasma etched to the silicon substrate 1 using fluorine chemistry, resulting in opening 3, as shown in FIG. 1B after photoresist removal. U.S. Pat. No. 4,832,787 to James A. Bondur et al. describes a preferred etch for the chlorine chemistry, that etches $Si_3N_4$ much faster than $SiO_2$. U.S. Pat. No. 5,702,981 to Papu D. Maniar et al., describes a preferred etch for the fluorine chemistry using $C_2F_6$ or $C_3F_8$, that etches $SiO_2$ much faster than $Si_3N_4$. The opening 3 will determine the position of a subsequent NMOS transistor, and is representative of many such openings in an integrated circuit.

Figure 1C:
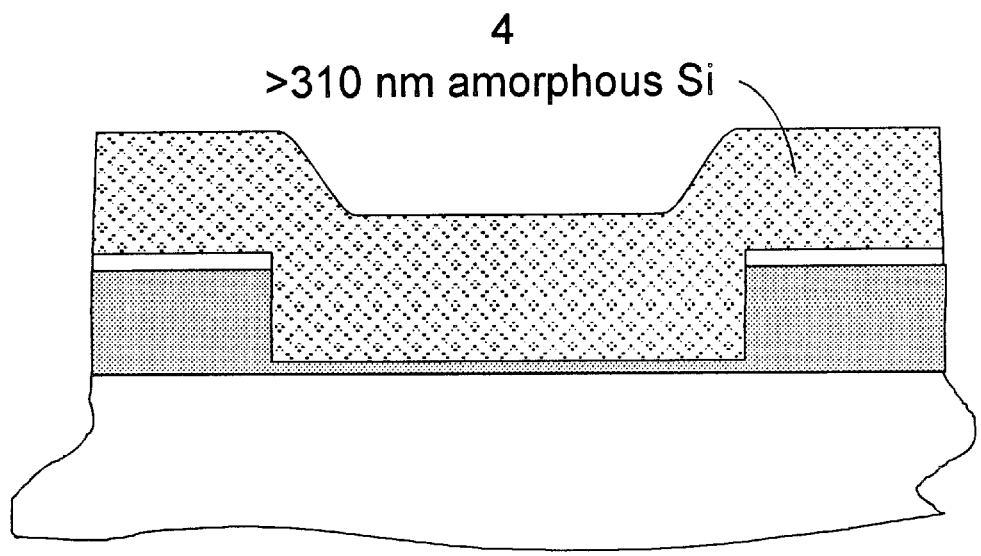
FIG. 1C shows the wafer after amorphous silicon deposition.

3. At the bottom of opening 3 a thin layer 3a of $SiO_2$~10 nm thick is grown, as shown in FIG. 1B. Next, as shown in FIG. 1C, a layer 4 of amorphous silicon is deposited that is thicker than 310 nm, so that it overfills opening 3.

Figure 2A:
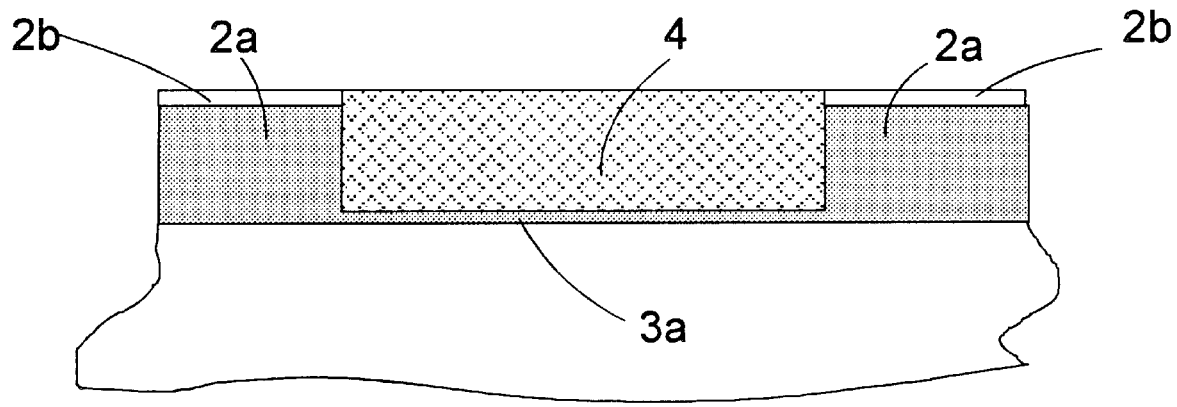
FIGS. 2A–2C show the wafer after chemical mechanical polishing of the amorphous silicon, after applying and patterning photoresist, after etching the amorphous silicon, and after N+ donor implantation.

4. Chemical mechanical polishing is performed on the amorphous silicon 4 using $Si_3N_4$ layer 2b as a polish stop, resulting in the top surface of the amorphous silicon 4 remaining in opening 3 being coplanar with the top surface of layer 2b, as shown in FIG. 2A. This polishing can be accomplished with a polishing pad using a slurry containing potassium hydroxide (KOH) and very small silica or alumina particles.

Figure 2B:
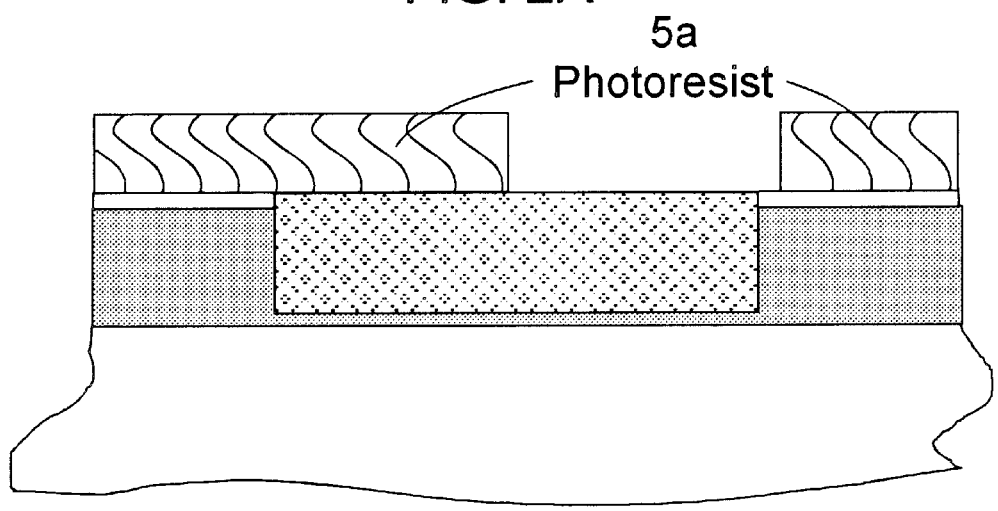
Figure 2C:
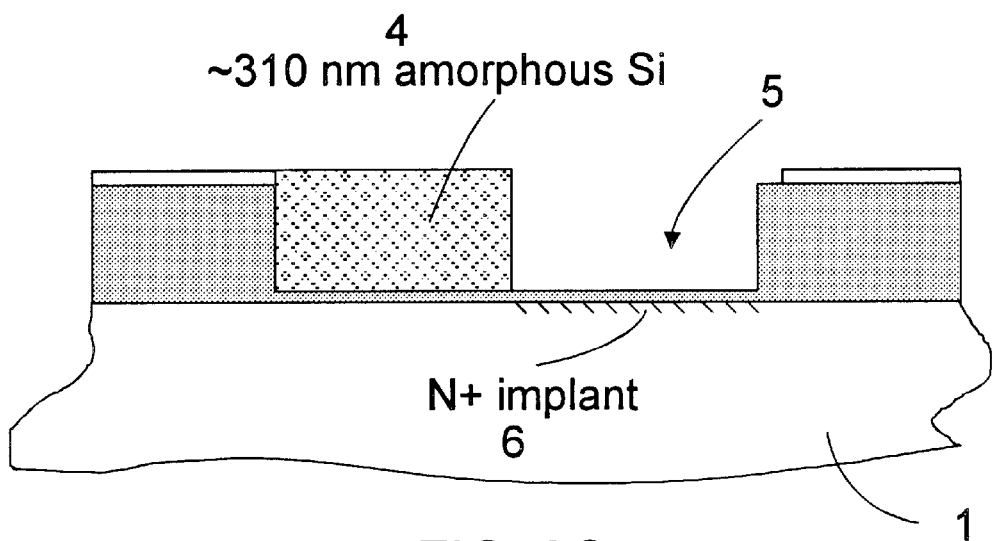

5. Photoresist 5a is applied and patterned as shown in FIG. 2B. With the photoresist 5a in place, the amorphous silicon 4 is anisotropically plasma etched, stopping at the underlying thin $SiO_2$ layer 3a, resulting in opening 5. This is preferably a bromine or chlorine based plasma that etches $SiO_2$ much more slowly than silicon, and produces near vertical sidewalls for the amorphous silicon. U.S. Pat. No. 5,169,487 to Rod C. Langley et al. describes a preferred plasma chemistry for this etch. With the photoresist 5a still in place a high dose N+ donor implant 6, of preferably arsenic, is performed with the photoresist 5a and amorphous silicon 4 protecting the portion of underlying silicon not implanted. The implant energy should be very low because only the thin layer 3a has to be penetrated. FIG. 2C shows the results of this after photoresist removal.

Figure 3C:
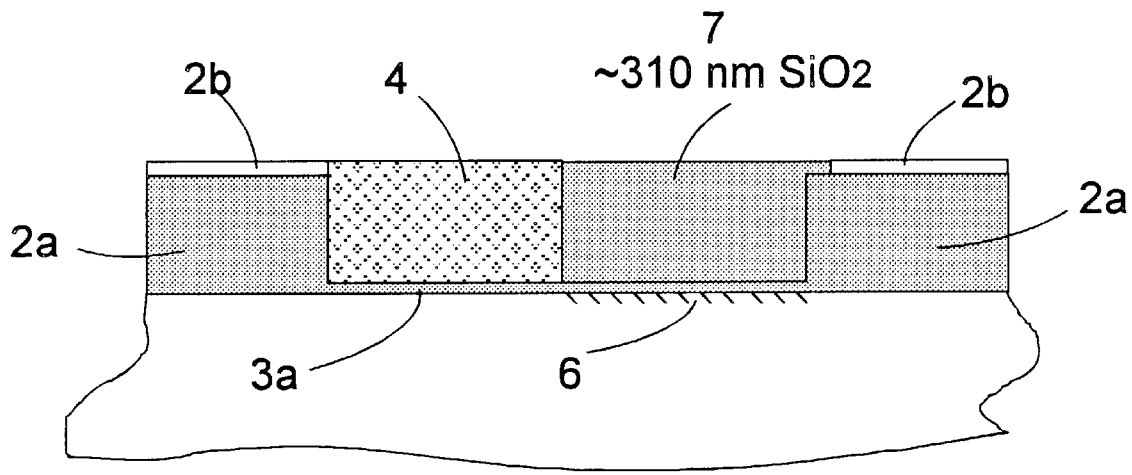
Figure 3C:
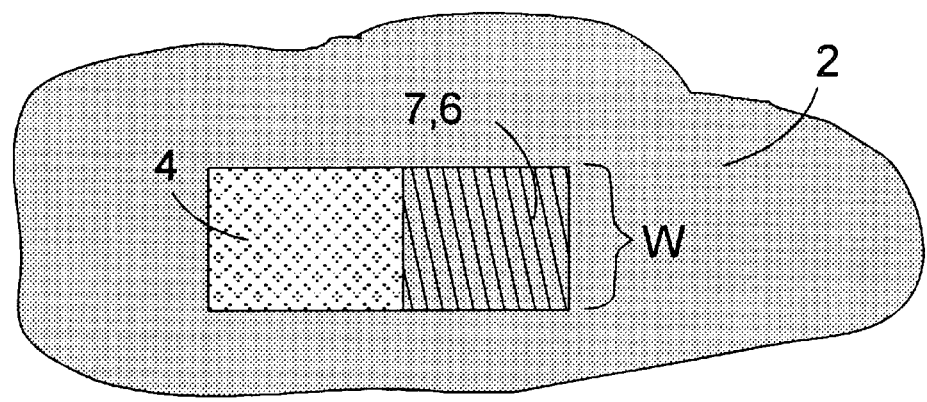
Figure 3C:
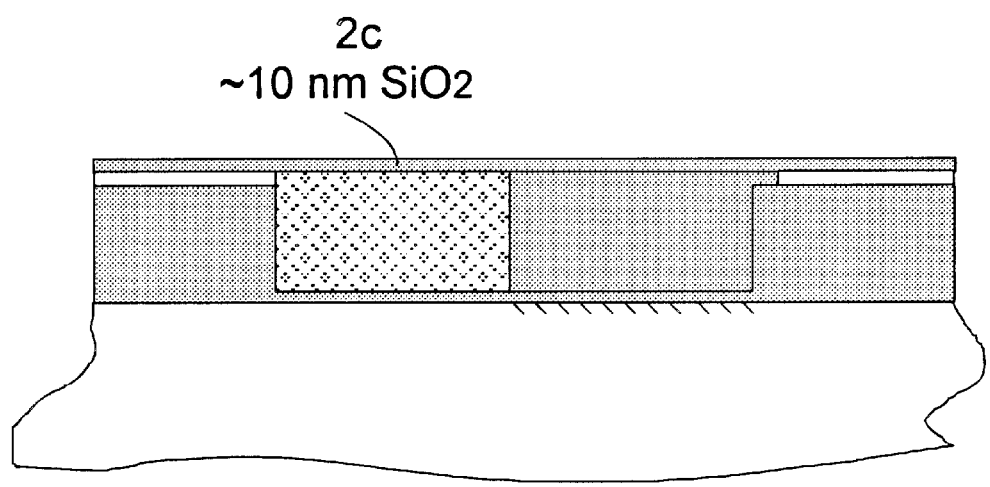

7. $SiO_2$ layer 7 is deposited to a thickness greater than the amorphous silicon 4 thickness. This $SiO_2$ can be deposited from tetraethylorthosilicate gas in a mixture with ozone at a temperature of approximately 400° C. Chemical mechanical polishing is performed on layer 7, using $Si_3N_4$ layer 2b as a polish stop, resulting in the top surface of layer 7 being coplanar with the top surfaces of layers 4 and 2b, as shown in FIGS. 3A and 3B. This polishing can be best accomplished as described in U.S. Pat. No. 5,759,917 to S. Grover Gautam et al.; this patent describes a slurry that preferentially polishes $SiO_2$ much faster than $Si_3N_4$. Finally, as shown in FIG. 3C, a thin layer 2c of $SiO_2$~10 nm thick is deposited.

Figure 4A:
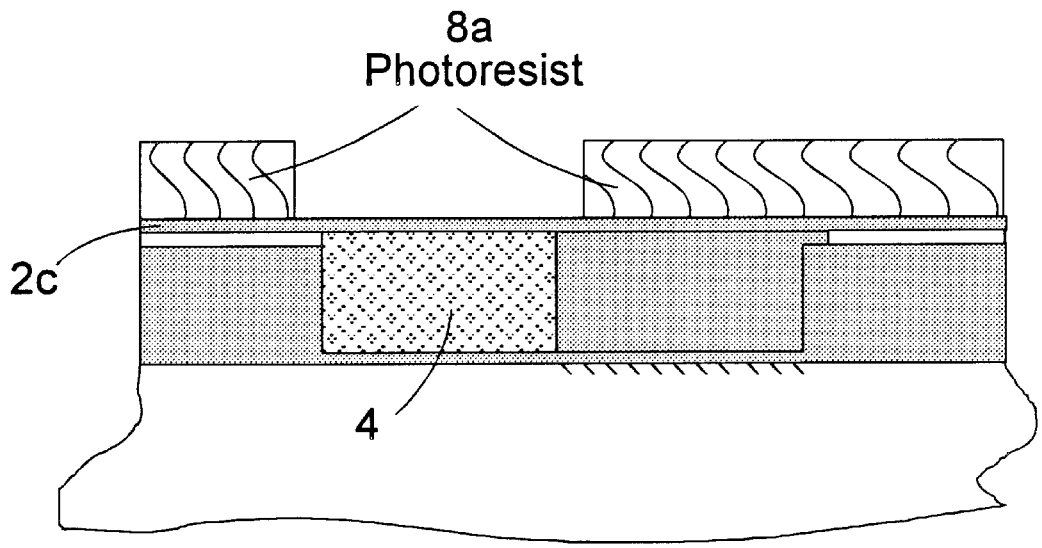
Figure 4B:
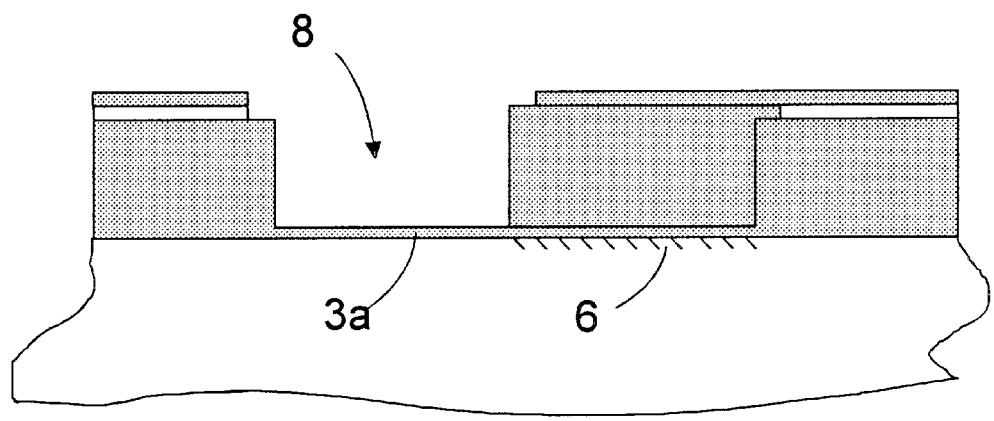

8. Photoresist 8a is applied and patterned to expose the remaining amorphous silicon 4 covered by $SiO_2$ layer 2c, as shown in FIG. 4A. The layer 2c not masked by photoresist is removed in a short fluorine chemistry plasma etch, and the amorphous silicon 4 is completely removed in a chlorine based plasma etch, stopping at the underlying thin $SiO_2$ layer 3a, and leaving opening 8, as shown in FIG. 4B.

Figure 4C:
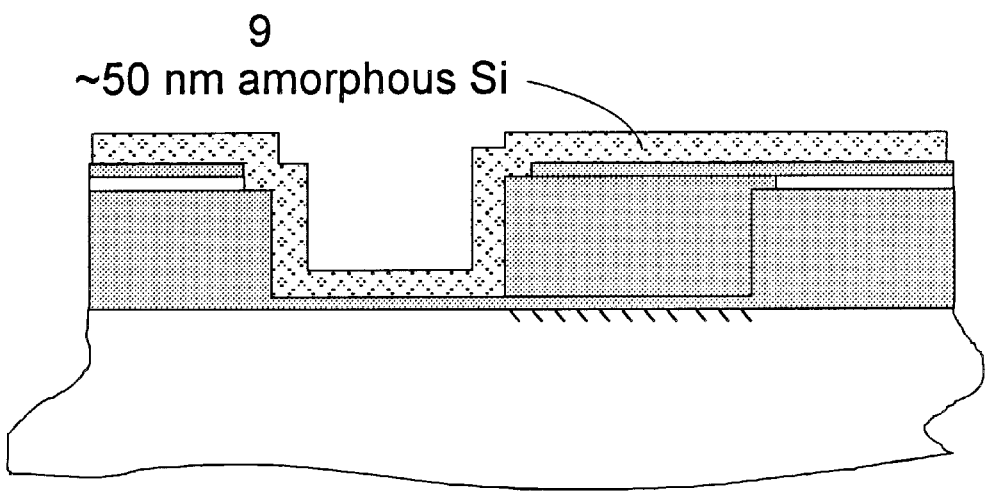

9. A thin layer 9 of amorphous silicon ~50 nm thick is conformally deposited, as shown in FIG. 4C. The thickness of layer 9 will determine the channel length of the final MOS transistor.

Figure 5A:
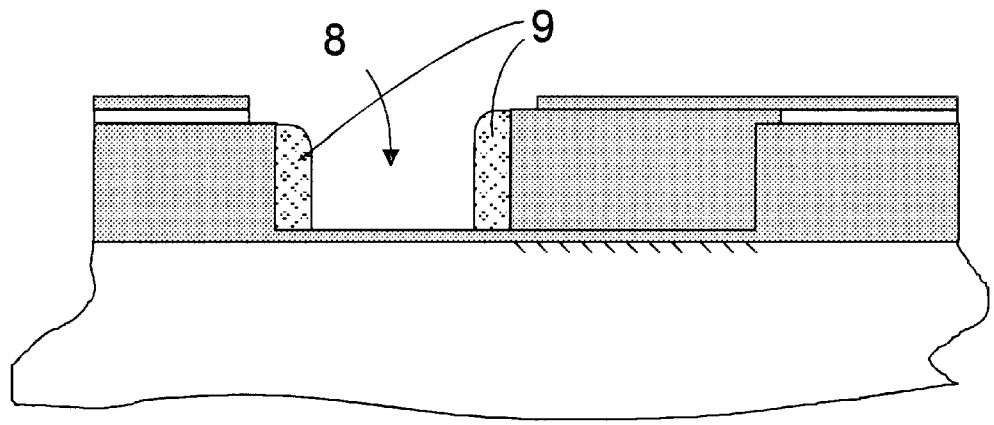

10. The amorphous silicon layer 9 is anisotropically etched for a short time in a chlorine chemistry plasma leaving layer 9 only on the side walls of opening 8, as shown in FIG. 5A.

Figure 5B:
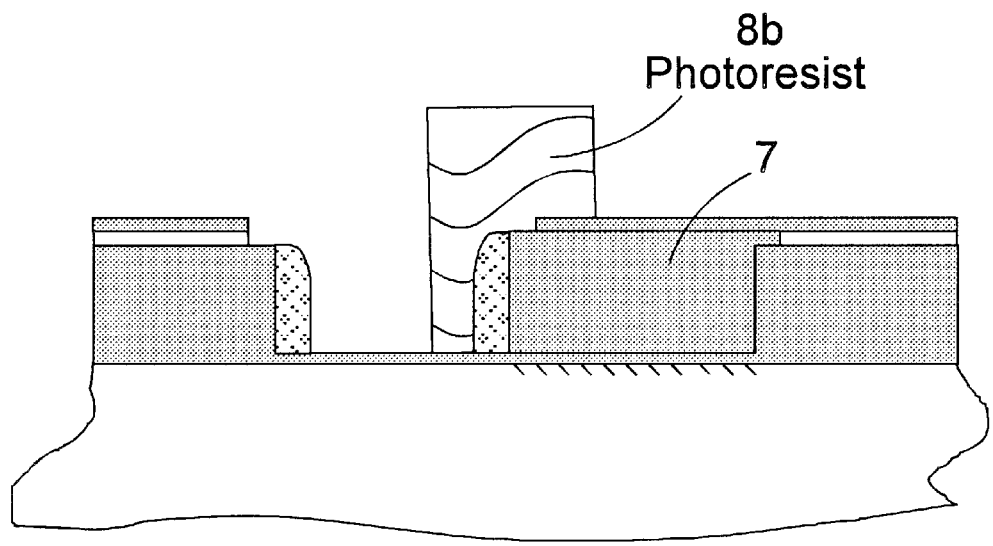
Figure 5C:
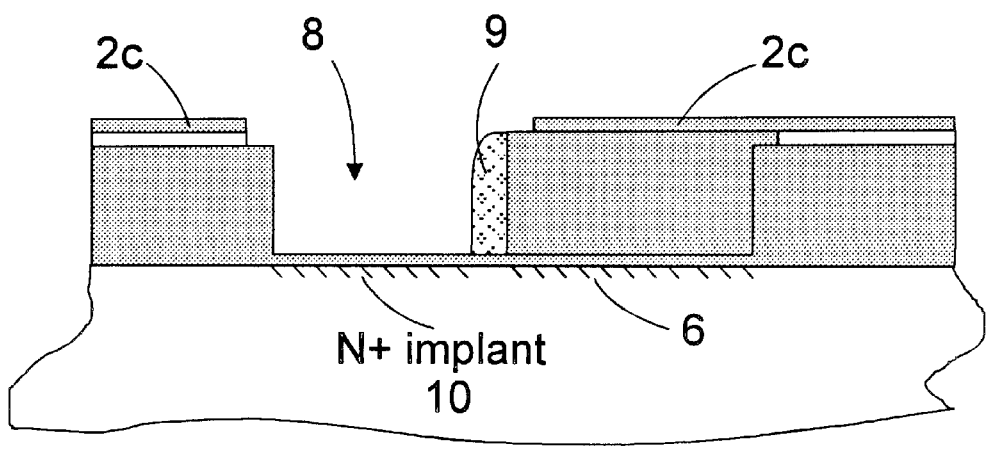

11. Photoresist 8b is applied and patterned to cover layer 9 on the side wall of $SiO_2$ region 7, as shown in FIG. 5B. The amorphous silicon 9 in opening 8 not covered by resist 8b is removed using a chlorine chemistry plasma. Another donor N+ implant 10 is made into the silicon at the bottom of opening 8, where layer 9 masks implanting into the silicon substrate adjacent to $SiO_2$ region 7. FIG. 5C shows this.

12. A layer 11 of $SiO_2$ is deposited to a thickness greater than the total thickness of layers 2a, 2b and 2c. This layer 11 is chemical mechanically polished using $Si_3N_4$ layer 2b as a polish stop, and in the process removing layer 2c, as shown in FIG. 6A. The layer 2b is removed using a short chlorine chemistry plasma etch. Then a timed short chemical mechanical polishing is performed to make a flat surface as shown in FIG. 6B. FIG. 6C is a top view of the same.

Figure 7A:
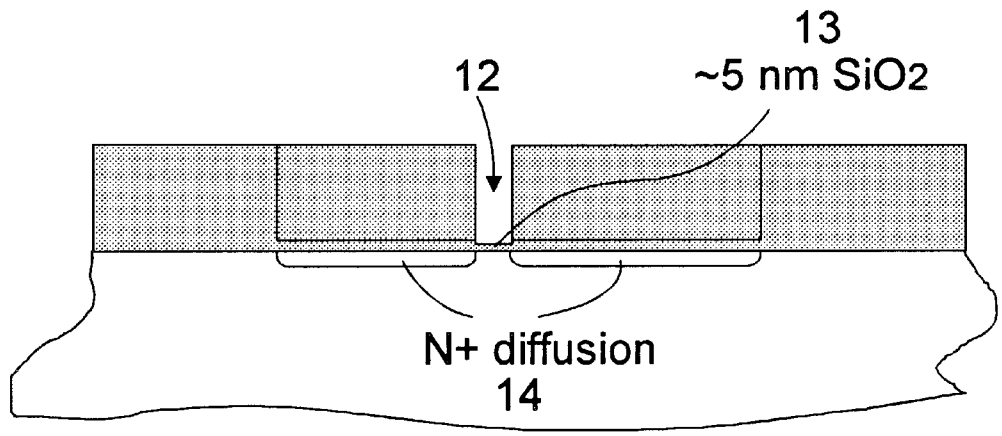
FIGS. 7A–7C show the wafer after removing amorphous silicon over the MOS channel region, after regrowing a gate silicon dioxide, after depositing a thin titanium nitride layer, after etching contact openings and after depositing a third N+ dopant into the wafer beneath these openings.

13. As shown in FIG. 7A, amorphous silicon 9 is removed using chlorine chemistry, leaving opening 12. Using a fluorine based etch the $SiO_2$ layer 3a is thinned or removed at the bottom of opening 12, and a thin gate layer 13 of $SiO_2$~5 nm is grown. The high temperature involved in growing layer 13 will activate and slightly diffuse implants 10 and 6 to make diffusions 14.

14. Before growing layer 13 one or more light doses of boron at different energies can be implanted for punch through control or field inversion control. For example, if the energy of the implant centers the boron at the layer 2a to underlying silicon 1 interface, the field inversion voltage will be raised; at the same time the implanted boron will be ~300 nm below the surface in the channel area, which will raise the source to drain punch through voltage.

Figure 7B:
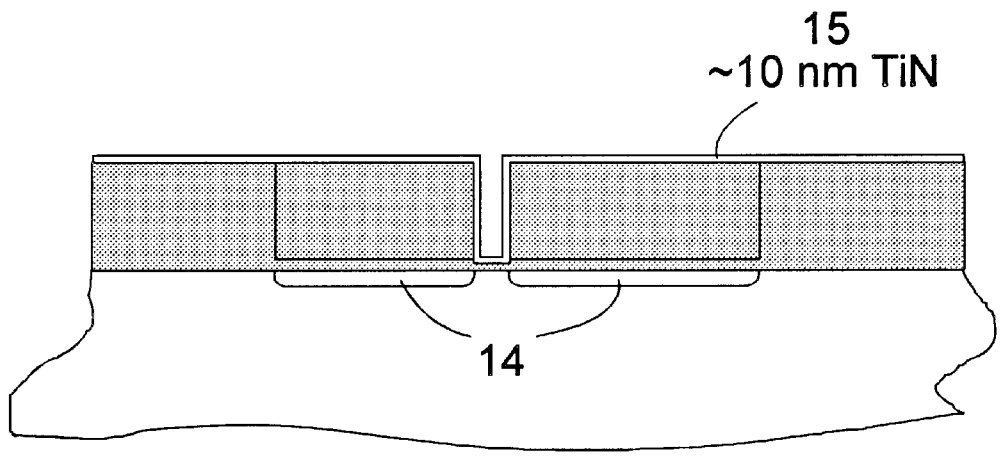
Figure 7C:
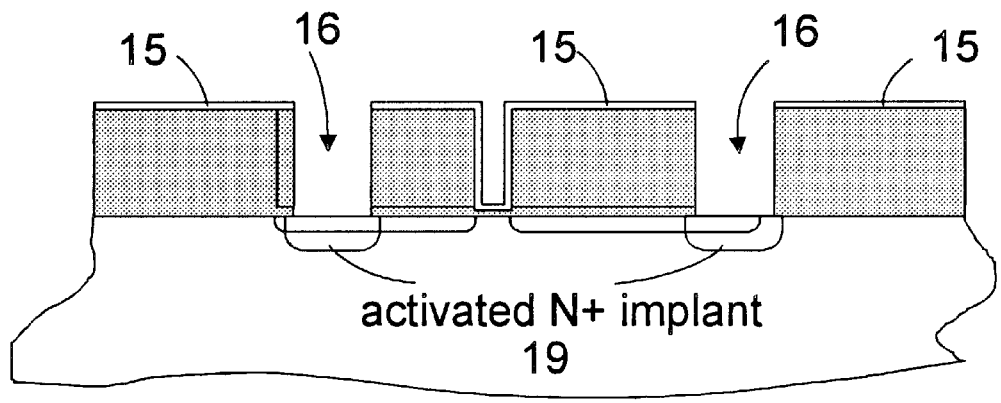

15. A thin layer 15 of titanium nitride (TiN) is deposited ~10 nm thick, as shown in FIG. 7B. Photoresist is patterned to define openings 16 and the TiN is plasma etched, using a chemistry of chlorine and helium; U.S. Pat. No. 5,035,768 to Xiao-Chun Mu et al. describes such an etch. With the photoresist still in place, openings 16 are anisotropically plasma etched using fluorine chemistry through the underlying $SiO_2$ stopping at the silicon substrate. With the photoresist still in place an N+ dopant is implanted into the silicon at the bottom of openings 16. The photoresist is removed and the dopant at the bottom of openings 16 is activated at a temperature of ~900° C., to make diffused regions 19; the results of this are shown in FIG. 7C. These extra diffusions 19 allow for borderless contacts to diffusions 14.

Figure 8A:
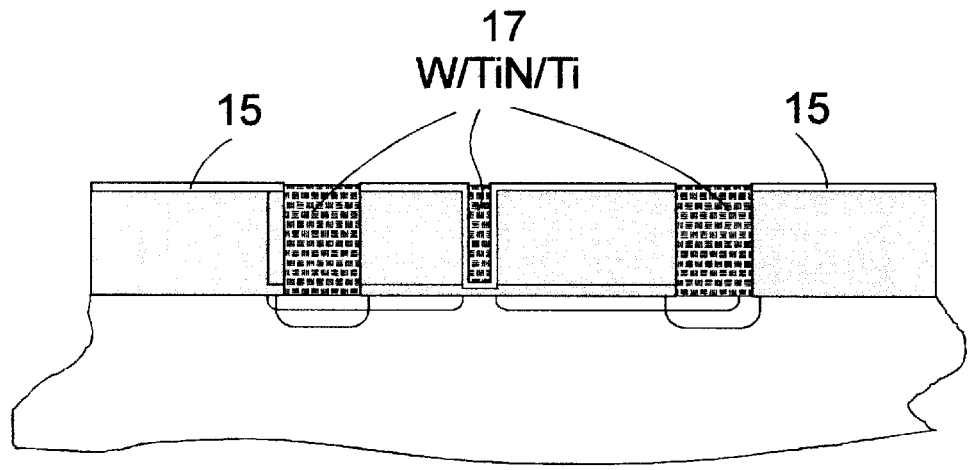
FIG. 8A shows the wafer after depositing a triple layer of thin titanium, thin titanium nitride and thick tungsten, and after chemical mechanical planarizing the tungsten.

16. A triple layer 17 is deposited consisting of a first thin layer of titanium (Ti) ~5 nm thick, followed by a thin layer of TiN ~5 nm thick, finished with a layer of tungsten (W) thicker than the depth of the openings 16. The Ti assures an ohmic contact to the N+ diffusions 19. The TiN acts as a barrier layer between the W and the Ti. The W is chemically mechanically polished using the thin Ti or layer 15 as a polish stop, ending with a flat surface. This etch is best performed as described in U.S. Pat. No. 5,516,346 to K. C. Cadien. The results of this are shown in FIG. 8A.

Figure 8B:
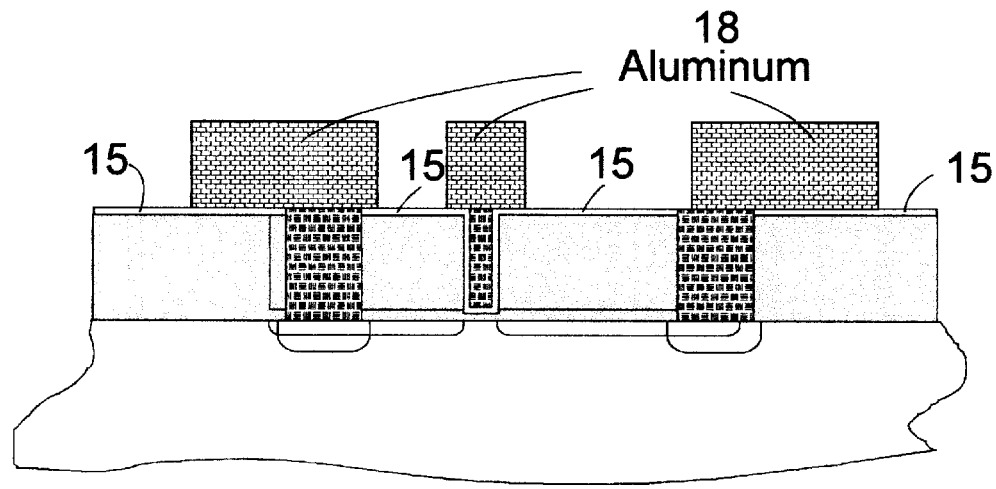
FIGS. 8B and 8C show the wafer after depositing a thick aluminum layer and patterning it for interconnections.
Figure 8C:
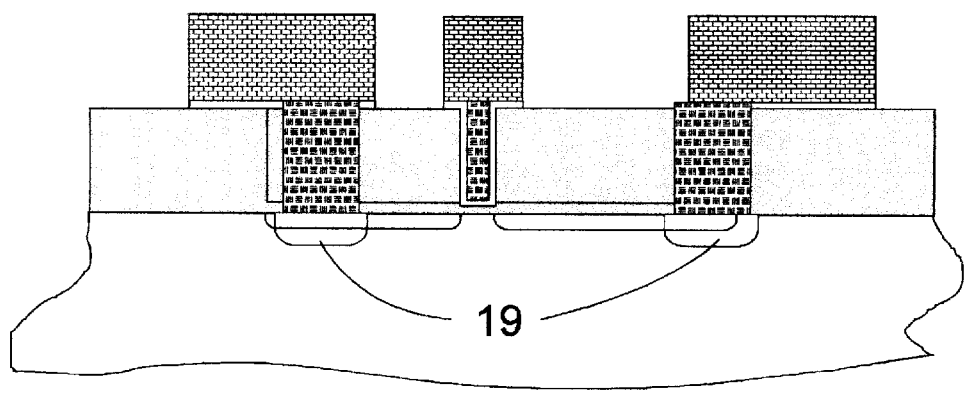

17. A thick layer 18 of ~300 nm aluminum is deposited. Photoresist is applied and patterned to define interconnects. The aluminum is anisotropically plasma etched in a chlorine chemistry, which will also etch the underlying thin layers of Ti or TiN; chlorine chemistry will not appreciably etch the tungsten 17 if it is exposed due to misalignment. FIGS. 8A and 8B shows this. U.S. Pat. No. 5,387,556 to Diane M. Xiaobing et al. is one of many U.S. patents that describe suitable chlorine based plasma etches for aluminum. Because the thin underlying layer 15 is not removed until after the aluminum is patterned, there are never any floating gates during processing that might be plasma damaged.

What is claimed is:

1. A processing method for forming an ultra short channel region for an MOS transistor, comprised of the following steps:

a) coating a single crystal silicon substrate (1) with a dielectric multilayer (2) consisting of one or more layers;

b) etching an opening (3) through multilayer (2), where the shape of opening (3) defines the source, drain and channel regions of said MOS transistor;

c) depositing a layer of material (4) thicker than the depth of opening (3);

d) planarizing material (4) to a height coplanar with the top surface of multilayer (2), leaving material (4) only in opening (3);

e) removing material (4) from a portion of opening (3), leaving opening (5) positioned over the subsequent drain diffusion of said MOS transistor;

f) implanting dopant (6) into the silicon substrate (1) beneath opening (5);

g) depositing a layer of dielectric material (7) thicker than the depth of opening (5);

h) planarizing material (7) to a height coplanar with the top surface of multilayer (2);

i) removing the remaining material (4) in opening (3), leaving opening (8);

j) depositing a layer of material (9) to a thickness approximately the same as the channel length of the subsequent said MOS transistor;

k) anisotropically plasma etching to remove material (9) everywhere except from the sidewalls of opening (8);

l) masking and removing material (9) from all of the sidewalls of opening (8) except from the sidewall of opening (8) adjacent to material (7);

m) implanting dopant (10) into the silicon substrate (1) beneath openings (8), but not into the substrate (1) beneath material (9);

n) depositing a layer of dielectric material (11) thicker than the depth of opening (3);

o) planarizing materials (11), (7), and (2) to expose material (9);

p) removing material (9), using an etch that doesn't significantly etch multilayer (2), or materials (7) and (11), creating opening (12);

q) removing any material at the bottom of opening (12), and creating the MOS transistor gate dielectric (13) at the bottom of opening (12);

r) high temperature activating Implants (6) and (10) to make diffusions (14).

2. A processing method for forming an ultra short channel MOS transistor, comprised of the following steps:

a) coating a single crystal silicon substrate (1) with a dielectric muftilayer (2) consisting of one or more layers;

b) etching an opening (3) through muftilayer (2), where the shape of opening (3) defines the source, drain and channel regions of said MOS transistor;

c) depositing a layer of material (4) thicker than the depth of opening (3);

d) planarizing material (4) to a height coplanar with the top surface of multilayer (2), leaving material (4) only in opening (3);

e) removing material (4) from a portion of opening (3), leaving opening (5) positioned over the subsequent drain diffusion of said MOS transistor;

f) implanting dopant (6) into the silicon substrate (1) beneath opening (5);

g) depositing a layer of dielectric material (7) thicker than the depth of opening (5);

h) planarizing material (7) to a height coplanar with the top surface of multilayer (2);

i) removing the remaining material (4) in opening (3), leaving opening (8);

j) depositing a layer of material (9) to a thickness approximately the same as the channel length of the subsequent said MOS transistor;

k) anisotropically plasma etching to remove material (9) everywhere except from the sidewalls of opening (8);

l) masking and removing material (9) from all of the sidewalls of opening (8) except from the sidewall of opening (8) adjacent to material (7);

m) implanting dopant (10) into the silicon substrate (1) beneath openings (8), but not into the substrate (1) beneath material (9);

n) depositing a layer of dielectric material (11) thicker than the depth of opening (3);

o) planarizing materials (11), (7), and (2) to expose material (9);

p) removing material (9), using an etch that doesn't significantly etch multilayer (2), or materials (7) and (11), creating opening (12);

q) removing any material at the bottom of opening (12), and creating said MOS transistor gate dielectric (13) at the bottom of opening (12);

r) high temperature activating implants (6) and (10) to make diffusions (14);

s) depositing conductor layer (15);

t) etching contact openings through layer (15) and materials (5) and (7) to diffusions (14), making openings (16);

u) depositing multilayer conductor material (17) thicker than depth of openings (16);

v) planarizing material (17);

w) depositing conductor material (18);

x) patterning conductors (18), (17) and (15) to form source, drain and gate connections to said MOS transistor.

3. The method of claim 2, where material (4) is anisotropically etched in step (e).

4. The method of claim 2, where material (4) is partially anisotropically etched in step (e), and the anisotropic etching is finished after step (f) and before step (g).

5. The method of claim 2, where layer (15) is titanium nitride.

6. The method of claim 2, where multilayer (17) consists of a first thin layer (17a) of titanium, followed by a thin layer (17b) of titanium nitride, finished by a thick layer (17c) of tungsten.

7. The method of claim 6, where the layer (17c) is chemical mechanically polished using any of layers (17b), (17a) or (15) as a polish stop.

8. The method of claim 2, where one or more light ion Implants are made through opening (12) into substrate (1) between steps (p) and (s), for purposes of field inversion control, punch through control or threshold control.

9. The method of claim 2, where two or more ion implants are made in each of steps (f) and (m) to control the junction profiles, for minimization of hot carrier problems.

10. The method of claim 2, where one or more ion implants of dopant (19) are made between steps (t) and (u).

11. The method of claim 10 where a short high temperature anneal is performed after the dopant (19) is implanted.

12. The method of claim 2, where the substrate (1) has a previously implanted well diffusion positioned beneath opening (3).

* * * * *